United States Patent
Nuzman

(10) Patent No.: US 11,558,066 B2
(45) Date of Patent: Jan. 17, 2023

(54) ENCODING AND DECODING WITH DIFFERENTIAL ENCODING SIZE

(71) Applicant: Alcatel Lucent, Nozay (FR)

(72) Inventor: Carl Nuzman, Union, NJ (US)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 17/545,271

(22) Filed: Dec. 8, 2021

(65) Prior Publication Data
US 2022/0123764 A1      Apr. 21, 2022

Related U.S. Application Data

(63) Continuation of application No. 16/321,540, filed as application No. PCT/EP2017/071489 on Aug. 28, 2017, now abandoned.

(30) Foreign Application Priority Data

Aug. 30, 2016 (EP) .................................... 16306093

(51) Int. Cl.
*H03M 7/40* (2006.01)
*H03M 7/30* (2006.01)

(52) U.S. Cl.
CPC ........... *H03M 7/40* (2013.01); *H03M 7/6005* (2013.01); *H03M 7/6011* (2013.01); *H03M 7/3062* (2013.01)

(58) Field of Classification Search
CPC ........ H03M 7/40; H03M 7/42; H03M 7/4018; H03M 7/46; H03M 13/1154;

(Continued)

(56) References Cited

U.S. PATENT DOCUMENTS 5,909,463 A * 6/1999 Johnson .............. H04L 27/0002
                                                                370/464
6,014,095 A    1/2000 Yokoyama
(Continued)

FOREIGN PATENT DOCUMENTS

WO    WO-2010/075559 A1    7/2010

OTHER PUBLICATIONS

"Very High Speed Digital Subscriber Line Transceiver 2", ref. G993.2. Top Link Located at URL: https://www.itu.int/rec/T-REC-G.993.2.
(Continued)

*Primary Examiner* — Linh V Nguyen
(74) *Attorney, Agent, or Firm* — Harness, Dickey & Pierce, P.L.C.

(57) ABSTRACT

In accordance with an embodiment, the method includes determining a second sequence of numbers of digits for encoding the respective integer coefficient values of the first sequence, the second sequence including, as first element, a first number of digits for encoding the first integer coefficient value of the first sequence, and as second and subsequent elements, constrained numbers of digits that are greater than or equal to respective minimum required numbers of digits for encoding the second and subsequent integer coefficient values of the first sequence. The constrained numbers of digits are such that any two successive elements of the second sequence do not differ from each other by more than a given threshold value. The method further includes encoding difference values between the successive elements of the second sequence; and encoding the integer coefficient values of the first sequence using the respective numbers of digits of the second sequence.

17 Claims, 3 Drawing Sheets

(58) Field of Classification Search
CPC ........... H03M 13/1105; H03M 7/4006; H03M 7/3082; H03M 13/6312; H03M 13/6516; H04B 7/0456; H04B 3/32; H04B 2001/0416; H04B 7/0417; H04B 7/068; H04B 7/04; H04B 7/0413; H04B 10/2581; H04B 7/0686; H04B 7/18502; H04B 7/18504; H04B 7/18515; H04B 7/18517; H04B 7/18523; H04B 7/2041; H04B 3/04; H04B 3/238; H04B 7/005; H04B 7/0617; H04L 1/0002; H04L 1/0009; H04L 2025/03426; H04L 25/03343; H04L 25/03891
USPC .......................................... 341/67, 56, 59, 63
See application file for complete search history.

(56) References Cited

U.S. PATENT DOCUMENTS

| | | | |
|---|---|---|---|
| 7,315,571 B1* | 1/2008 | Heidari | H04L 5/0064 375/267 |
| 8,225,185 B1 | 7/2012 | Tang et al. | |
| 8,744,025 B2* | 6/2014 | Lowdermilk | G01R 23/16 375/267 |
| 2004/0208257 A1* | 10/2004 | Bessios | H04L 25/4915 375/286 |
| 2007/0165959 A1* | 7/2007 | Takada | H04N 19/64 382/240 |
| 2012/0020418 A1 | 1/2012 | Sands et al. | |
| 2013/0279569 A1* | 10/2013 | Gao | H03M 7/4031 375/240.03 |
| 2014/0023127 A1 | 1/2014 | Pereira | |
| 2014/0105511 A1* | 4/2014 | Kosinski | G06T 9/001 341/51 |
| 2015/0244418 A1 | 8/2015 | Verbin et al. | |
| 2015/0380050 A1* | 12/2015 | Krachkovsky | G11B 20/1217 360/40 |
| 2018/0316386 A1* | 11/2018 | Verbin | H04M 11/062 |
| 2018/0343468 A1* | 11/2018 | Harrell | H04N 19/179 |

OTHER PUBLICATIONS

International Search Report PCT/ISA/210 for PCT International Application PCT/EP2017/071489.

* cited by examiner

ENCODING AND DECODING WITH DIFFERENTIAL ENCODING SIZE

CROSS-REFERENCE TO RELATED APPLICATIONS

This is a Continuation of U.S. application Ser. No. 16/321,540, filed on Jan. 29, 2019, which is a national phase under 35 U.S.C. § 371 of PCT International Application No. PCT/EP2017/071489 which has an international filing date of Aug. 28, 2017, which claims priority to European Application No. 16306093.2, filed Aug. 30, 2016, the entire contents of each of which are hereby incorporated by reference.

TECHNICAL FIELD OF THE INVENTION

The present invention relates to a compression and decompression method and apparatus for efficiently storing and retrieving vectoring coefficients in a Vectoring Processor (VP).

TECHNICAL BACKGROUND OF THE INVENTION

Crosstalk is a major impairment for wired communication systems, such as Digital Subscriber Line (xDSL) communication systems.

Crosstalk arise from Electro-Magnetic (EM) interference between neighboring transmission lines, that is to say transmission lines that are in close vicinity over part or whole of their length, such as twisted copper pairs in a cable binder. Far-End Crosstalk (FEXT) is caused by communication signals being transmitted in a given direction, and that interfere at far-end receivers with communications signals traveling along neighboring transmission lines in the same direction. Near-End Crosstalk (NEXT) is caused by communication signals being transmitted in a given direction, and that interfere at near-end receivers with communications signals traveling along neighboring transmission lines in the opposite direction.

One easily gets rid of NEXT by adopting Frequency Division Duplexing (FDD) and/or Time Division Duplexing (FDD) schemes for downstream and upstream communications.

Yet, FEXT remains a predominant source of noise for wired communication systems. This is especially true as systems are evolving toward higher frequency bands in order to meet the demand for higher data rates (the higher frequency, the more EM coupling). For instance, in the recommendation entitled "*Very High Speed Digital Subscriber Line Transceivers 2*", ref. G.993.2, and adopted by the International Telecommunication Union (ITU) in April 2010 (VDSL2 hereinafter), the transmit spectrum has been broadened from 2,208 MHz (ADSL2+) up to 17,664 MHz or 35,328 MHz with respective transmit profile 17a or 35b and 4,3125 kHz tone spacing. In G.9701 ITU recommendation (G.fast hereinafter), the transmit spectrum goes up to 105, 93225 MHz or 211,8645 MHz with respective transmit profiles 106a or 212a and 51.75 kHz tone spacing.

Different strategies have been developed to mitigate FEXT, and to maximize effective throughput, reach and line stability.

Static or dynamic spectrum management techniques were initially proposed as a way to cope with the increased level of FEXT by proper transmit power shaping. For instance, Upstream Power Back-Off (USPBO), Optimal Spectrum Balancing (OSB) or water-filing power allocation schemes confine the induced level of FEXT within acceptable bounds while restoring some user fairness across the loop plant.

Multi-user signal coordination (a.k.a. vectoring) goes one step further by annihilating the FEXT signals at the respective receivers. vectoring assumes full channel and signal knowledge. This bleeding-edge technology paved the way for record-breaking transmission rates over copper pairs (as much as 1 Gbps aggregate data rate over a 200 m loop), closing the gap with optical transmission. Vectoring, which has been initially proposed as an amendment to G.993.5 VDSL2 recommendation, forms now an integral part of new G.9701 G.fast recommendation.

Vectoring encompasses two main techniques: joint signal pre-processing (a.k.a. precoding) and joint signal post-processing (a.k.a. postcoding).

With signal precoding, the user data symbols are jointly passed through a precoder before being transmitted over the respective communication channels. The precoder is such that the concatenation of the precoder and the communication channels results in little or no FEXT at the receivers. Practically, and as a first order approximation, the precoder superimposes anti-phase crosstalk pre-compensation signals over the victim line along with the direct signal that destructively interfere at the receiver with the actual FEXT signals from the respective disturber lines.

With signal postcoding, the data symbols received from the respective communication channels are jointly passed through a postcoder (a.k.a. crosstalk cancellation filter) before being detected. The postcoder is such that the concatenation of the communication channels and the postcoder results in little or no FEXT at the detectors.

Signal vectoring is typically performed at a traffic aggregation point as multi-user signal coordination between co-located transceivers is required: signal precoding is particularly appropriate for downstream communication (i.e., toward customer premises), while signal postcoding is particularly appropriate for upstream communication (i.e., from customer premises).

More formally, an N×N Multiple Input Multiple Output (MIMO) channel can be described by the following linear model:

$$y_k = H_k x_k + z_k \quad (1),$$

wherein the N-component complex vector $x_k$, respectively $y_k$, is a discrete frequency representation, as a function of the frequency index k, of the symbols transmitted over, respectively received from, the N vectored channels, wherein the N×N complex matrix $H_k$ is the channel matrix: the (i,j)-th component $H_{i,j}$ of the channel matrix $H_k$ describes how the communication system produces a signal on the i-th channel output in response to a signal being fed to the j-th channel input; the diagonal elements of the channel matrix describe direct channel coupling, and the off-diagonal elements of the channel matrix (a.k.a. crosstalk coefficients) describe inter-channel coupling, and wherein the N-component complex vector $z_k$ denotes additive noise over the N channels, such as Radio Frequency Interference (RFI) or thermal noise.

Signal precoding and postcoding are advantageously implemented by means of matrix products.

In downstream, a linear precoder performs a matrix-product in the frequency domain of a data vector $u_k$ with a precoding matrix $P_k$ before actual transmission over the respective communication channels, i.e. actual transmit vector is $x_k = P_k u_k$. The precoding matrix $P_k$ is such that the overall channel matrix $H_k P_k$ is diagonalized, meaning the off-diagonal coefficients of the overall channel $H_kP_k$, and thus the inter-channel interference, are substantially reduced.

In upstream, a linear postcoder performs a matrix-product in the frequency domain of the receive vector $y_k$ with a postcoding matrix $Q_k$ to recover the data vector $u_k$ (after channel equalization), i.e. detection is performed on $y'_k=Q_ky_k$. The postcoding matrix $P_k$ is such that the overall channel matrix $Q_kH_k$ is diagonalized.

The choice of the vectoring group, that is to say the set of communication lines, the signals of which are jointly processed, is rather critical for achieving good crosstalk mitigation performances. Ideally, the vectoring group should match the whole set of communication lines that physically and noticeably interact with each other. within a vectoring group, each communication line is considered as a disturber line inducing crosstalk into the other communication lines of the group, and the same communication line is considered as a victim line receiving crosstalk from the other communication lines of the group. Crosstalk from lines that do not belong to the vectoring group is treated as alien noise and is not canceled.

The complex coefficients of the preceding and postcoding matrix (a.k.a. vectoring coefficients) need to be stored for all disturber-victim lines combinations, and for all tones used for downstream and upstream communications respectively. These coefficients are stored in the so-called on-chip VP memory for fast and easy retrieval, and are decoded on the fly as the tone data are being jointly processed. These complex coefficients nominally occupies $2N^2K$ register memories, each register memories holding the real or imaginary part of a single vectoring coefficient. N denotes the size of the vectoring group, and is typically in the order of up to a few hundred vectored lines for VDSL2 and a few dozens vectored lines for G.fast, and K denotes the number of applicable tones, typically 4096 or 8192, meaning as many as $2,4.10^9$ register memories for 384 vectored lines and 8192 tones. However, the amount of on-chip memory is constrained by cost and space considerations, and one has to come up with some lossless and/or lossy compression schemes for reducing the storage requirements of the VP while maintaining a desired level of fidelity for the decompressed coefficients.

More specifically, an overall compression scheme typically includes lossy and lossless portions. The lossy portion may include sub-sampling and interpolation, as well as quantization. The lossless portion reduces the size of the stored coefficients at a further extent by proper encoding, while allowing the original coefficients to be perfectly reconstructed from the compressed coefficients.

An example of lossless encoding is the so-called Golomb encoding, whereby unsigned integer coefficient values representing the real or imaginary part of the vectoring coefficients are divided by a modulus integer parameter $2^m$. The quotient value of the Euclidean division is encoded in unary code, i.e. with 0, 1, 2, 3, . . . encoded as 0, 10, 110, 1110, . . . , and the remainder of the Euclidean division is encoded as a binary word of length m. The modulus parameter m can be tailored on a per frequency band basis as described in the US patent application entitled "*System and Method for Selecting Parameters for Compressing Coefficients for Nodescale Vectoring*", and published on Jan. 23, 2014 with publication number US 2014/0023127 A1.

This solution works well in many cases where the disturbers and tone groups are fairly homogeneous, so that the statistics of the vectoring coefficient values may be modeled as approximately independent and identical.

SUMMARY OF THE INVENTION

It is an object of the present invention to define an efficient compression scheme and apparatus, and related decompression scheme and apparatus, for encoding and decoding coupling coefficient values, being vectoring or channel coefficient values.

In accordance with a first aspect of the invention, a method for encoding a first sequence of integer coefficient values indicative of coupling coefficient values comprises determining a second sequence of numbers of digits for encoding the respective integer coefficient values of the first sequence, the second sequence comprising, as first element, a first number of digits for encoding the first integer coefficient value of the first sequence, and as second and subsequent elements, constrained numbers of digits that are greater than or equal to respective minimum required numbers of digits for encoding the second and subsequent integer coefficient values of the first sequence, the constrained numbers of digits being such that any two successive elements of the second sequence do not differ from each other by more than a given threshold value; encoding difference values between the successive elements of the second sequence; and encoding the integer coefficient values of the first sequence using the respective numbers of digits of the second sequence.

In one embodiment of the invention, the method further comprises encoding a further first sequence of integer coefficient values using the respective numbers of digits of the second sequence. The constrained numbers of digits are greater than or equal to respective further minimum required numbers of digits for encoding the second and subsequent integer coefficient values of the further first sequence.

In one embodiment of the invention, the first number of digits is a nominal number of digits preliminarily known.

In one embodiment of the invention, the method further comprises adjusting the first number of digits of the second sequence; and encoding the so-adjusted first number of digits of the second sequence.

In one embodiment of the invention, the method further comprises initializing the second and subsequent numbers of digits of the second sequence as being equal to the respective minimum required numbers of digits; and incrementing at least one of the second and subsequent numbers of digits of the second sequence till the successive elements of the second sequence do not differ from each other by more than the given threshold value.

In one embodiment of the invention, the coupling coefficient values are vectoring coefficient values for use in a vectoring processor, the encoding is for the storage of the integer coefficient values in a memory area of the vectoring processor, and the first sequence corresponds to a particular disturber-victim combination.

In one embodiment of the invention, the integer coefficient values are indicative of respective quantization intervals wherein the respective coupling coefficient values are enclosed.

In one embodiment of the invention, the difference values are each encoded using $\text{Ceil}(\text{Log}_M(2T+1))$ digits. M denotes a radix of the numeral system that is used for representing integer values, T denotes the given threshold value, and Ceil(x) denotes the lowest integer value that is greater than or equal to x.

In one embodiment of the invention, the difference values are encoded using a variable-length code.

In accordance with another aspect of the invention, an encoder for encoding a first sequence of integer coefficient values indicative of coupling coefficient values is configured to determine a second sequence of numbers of digits for encoding the respective integer coefficient values of the first sequence, the second sequence comprising, as first element, a first number of digits for encoding the first integer coefficient value of the first sequence, and as second and subsequent elements, constrained numbers of digits that are greater than or equal to respective minimum required numbers of digits for encoding the second and subsequent integer coefficient values of the first sequence, the constrained numbers of digits being such that any two successive elements of the second sequence do not differ from each other by more than a given threshold value; to encode difference values between the successive elements of the second sequence; and to encode the integer coefficient values of the first sequence using the respective numbers of digits of the second sequence.

Embodiments of an encoder according to the invention correspond with the aforementioned embodiments of a method for encoding according to the invention.

Such an encoder typically forms part of a vectoring controller for controlling the operation of a vectoring processor, and configured to write the so-compressed integer coefficient values in a memory area of the vectoring processor.

In accordance with still another aspect of the invention, a method for decoding a first sequence of encoded integer coefficient values indicative of coupling coefficient values comprises decoding a first integer coefficient value of the first sequence using a first number of digits; decoding difference values between successive elements of a second sequence of numbers of digits, the second sequence having the first number of digits as first element; determining second and subsequent numbers of digits of the second sequence from the difference values; and decoding second and subsequent integer coefficient values of the first sequence using the respective so-determined second and subsequent numbers of digits of the second sequence.

In one embodiment of the invention, the first number of digits is a nominal number of digits preliminarily known.

In one embodiment of the invention, the method initially comprises decoding the first number of digits.

In one embodiment of the invention, the coupling coefficient values are vectoring coefficient values for use in a vectoring processor, the decoding is for the reading of the encoded integer coefficient values from a memory area of the vectoring processor, and the first sequence corresponds to a particular disturber-victim combination.

In accordance with still another aspect of the invention, a decoder for decoding a first sequence of encoded integer coefficient values indicative of coupling coefficient values is configured to decode a first integer coefficient value of the first sequence using a first number of digits; to decode difference values between successive elements of a second sequence of numbers of digits, the second sequence having the first number of digits as first element; to determine second and subsequent numbers of digits of the second sequence from the difference values; and to decode second and subsequent integer coefficient values of the first sequence using the respective so-determined second and subsequent numbers of digits of the second sequence.

Embodiments of a decoder according to the invention correspond with the aforementioned embodiments of a method for decoding according to the invention.

Such a decoder typically forms part of a vectoring processor for jointly processing communication signals, and configured to read the so-compressed integer coefficient values from a memory area.

The vectoring processor and vectoring controller typically forms part of an access node for providing broadband communication services to subscribers, such as a Digital Subscriber Line Access Multiplexer (DSLAM) or a Distribution Point Unit (DPU).

In practice, there are often disturbers with very different properties, meaning that the best encoding may depend strongly on the considered disturber. Also there may be strong correlations across frequency in the size of the integer coefficient values. These characteristics provide opportunity to encode the vectoring coefficients with fewer bits.

The idea is to use a variable length code that encodes each pair of real and imaginary components with the minimum number of bits required. Normally, significant additional overhead would be required to indicate to the decoder the number of bits used for encoding each integer value. with the proposed technique, this overhead is reduced by differentially encoding the new required number of bits used for encoding a new integer value with respect to a previously-determined number of bits used for encoding a previous integer value, after constraining the degree to which the number of bits can change from one tone group to the next. Encoding is carried out independently for each disturber.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
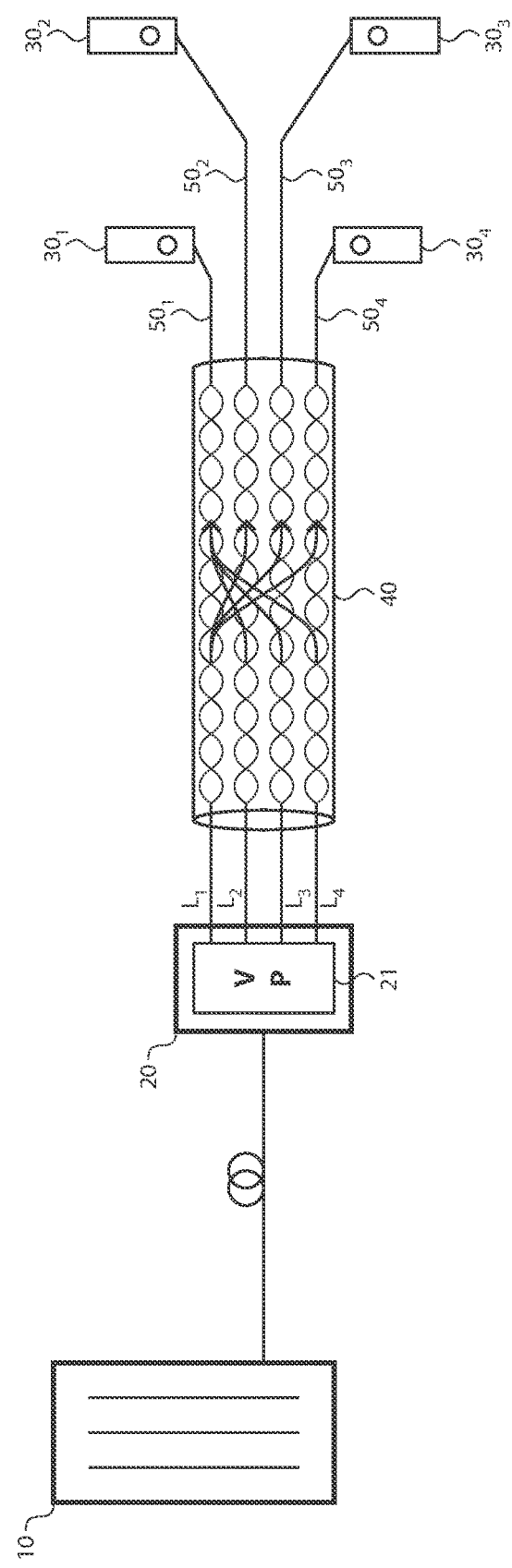
FIG. 1 represents an overview of a copper plant.

There is seen in FIG. 1 an access plant comprising a network unit 10 at a CO, an access node 20 coupled via one or more optical fibers to the network unit 10, and further coupled via a copper plant to Customer Premises Equipment (CPE) 30 at various subscriber locations. The transmission media of the copper plant is typically composed of copper Unshielded Twisted Pairs (UTP).

As an illustrative example, the copper plant comprises four subscriber lines $L_1$ to $L_4$ sharing a common access segment 40, and then going through dedicated loop segments 50 for final connection to CPEs $30_1$ to $30_4$ respectively.

Within the common access segment 40, the subscriber lines $L_1$ to $L_4$ are in close vicinity and thus induce FEXT into each other (see the arrows in FIG. 1 between the respective subscriber lines).

The access node 20 comprises a VP for jointly processing the data symbols that are being transmitted over, or received from, the copper plant in order to mitigate the FEXT and to increase the achievable data rates.

Figure 2:
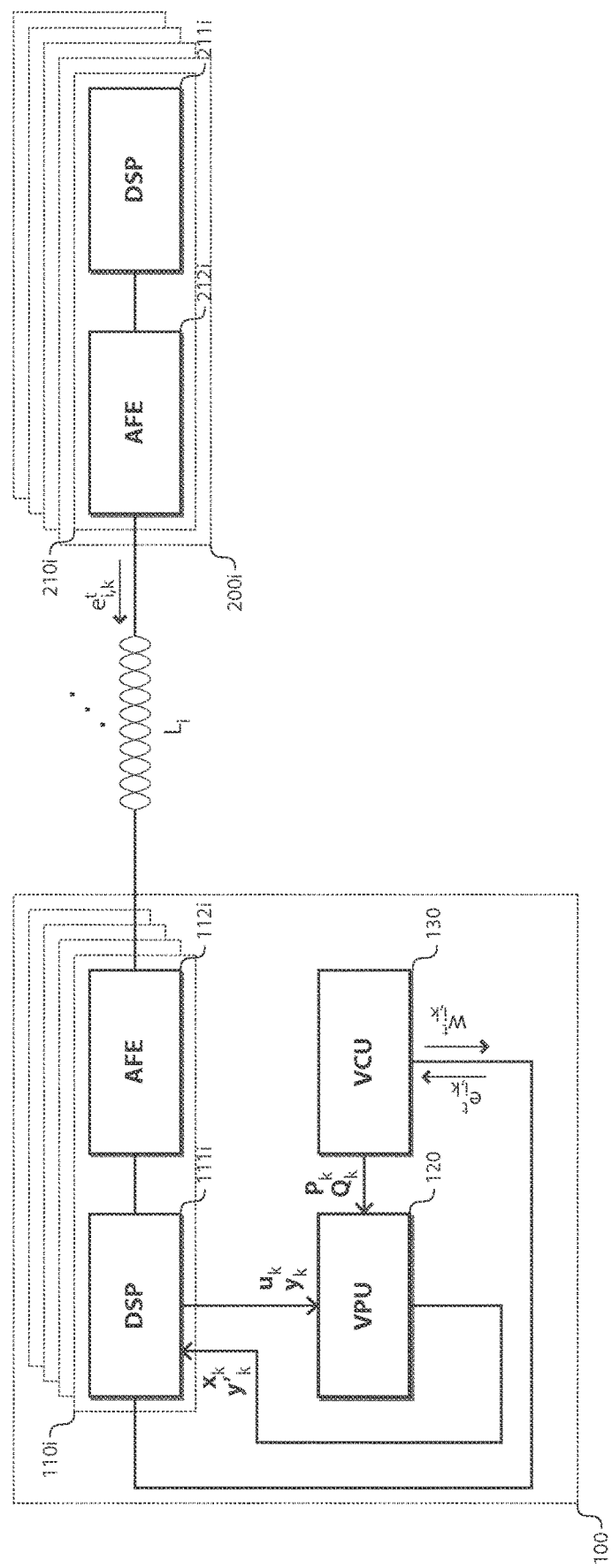
FIG. 2 represents further details about an access node.

There is seen in FIG. 2 further details about an access node 100 and respective CPEs 200.

The access node 100 comprises:
transceivers 110;
a Vectoring Processing Unit (VPU) 120; and
a Vectoring Control Unit (VCU) 130 for controlling the operation of the VPU 120.

The transceivers 110 are individually coupled to the VPU 120 and to the VCU 130. The VCU 130 is further coupled to the VPU 120.

The transceivers 110 individually comprise:
a Digital Signal Processor (DSP) 111; and
an Analog Front End (AFE) 112.

The transceivers 110 are coupled to respective transceivers 210 within the CPEs 200 through respective subscriber lines $L_1$ to $L_N$, which are assumed to form part of the same vectoring group.

The transceivers 210 individually comprise:
a Digital Signal Processor (DSP) 211; and
an Analog Front End (AFE) 212.

The AFEs 112 and 212 individually comprise a Digital-to-Analog Converter (DAC) and an Analog-to-Digital Converter (ADC), a transmit filter and a receive filter for confining the signal energy within the appropriate communication frequency bands while rejecting out-of-band interference, a line driver for amplifying the transmit signal and for driving the transmission line, and a Low Noise Amplifier (LNA) for amplifying the receive signal with as little noise as possible.

In case of Frequency Division Duplexing (FDD) operation where downstream and upstream communications operate simultaneously over the same transmission medium in distinct and non-overlapping frequency bands, the AFEs 112 and 212 further comprise a hybrid for coupling the transmitter output to the transmission medium and the transmission medium to the receiver input while achieving low transmitter-receiver coupling ratio. The AFE may further accommodate echo cancellation filters to reduce the coupling ratio at a further extent.

In case of Time Duplexing Division (TDD) operation where downstream and upstream communications operate over the same frequency band but in distinct and non-overlapping time slots, the hybrid can be advantageously omitted as the transmitter and receiver operate in alternate mode: the receive circuitry is switched OFF (or the receive signal is discarded) while the transmit circuitry is active, and the way around, the transmit circuitry is switched OFF while the receive circuitry is active.

The AFEs 112 and 212 further comprise impedance-matching circuitry for adapting to the characteristic impedance of the transmission medium, clipping circuitry for clipping any voltage or current surge occurring over the transmission medium, and isolation circuitry (typically a transformer) for DC-isolating the transceiver from the transmission medium.

The DSPs 111 and 211 are configured to operate downstream and upstream communication channels for conveying user traffic over the subscriber lines $L_1$ to $L_N$.

The DSPs 111 and 211 are further configured to operate downstream and upstream control channels that are used to transport control traffic, such as diagnosis, management or On-Line Reconfiguration (OLR) commands and responses. control traffic is multiplexed with user traffic over the transmission medium.

More specifically, the DSPs 111 and 211 are for encoding and modulating user and control data into DMT symbols, and for de-modulating and decoding user and control data from DMT symbols.

The following transmit steps are typically performed within the DSPs 111 and 211:
data encoding, such as data multiplexing, framing, scrambling, error correction encoding and interleaving;
signal modulation, comprising the steps of ordering the tones according to a tone ordering table, parsing the encoded bit stream according to the respective bit loadings of the ordered tones, and mapping each chunk of bits onto an appropriate transmit constellation point (with respective carrier amplitude and phase), possibly with Trellis coding;
signal scaling, such as power normalization, transmit PSD shaping and transmit gain scaling;
Inverse Fast Fourier Transform (IFFT);
Cyclic Prefix (CP) insertion; and
time-windowing.

The following receive steps are typically performed within the DSPs 111 and 211:
time-windowing and CP removal;
Fast Fourier Transform (FFT);
Frequency EQualization (FEQ);
signal de-modulation and detection, comprising the steps of applying to each and every equalized frequency sample an appropriate constellation grid, the pattern of which depends on the respective bit loading, detecting the expected transmit constellation point and the corresponding transmit bit sequence, possibly with Trellis decoding, and re-ordering all the detected chunks of bits according to the tone ordering table; and
data decoding, such as data de-interleaving, error correction decoding, de-scrambling, frame delineation and de-multiplexing.

Some of these transmit or receive steps can be omitted, or some additional steps can be present, depending on the exact digital communication technology being used.

The DSPs 111 are further configured to supply transmit frequency samples $u_k$ to the VPU 120 before Inverse Fast Fourier Transform (IFFT) for joint signal precoding, and to supply receive frequency samples $y_k$ to the VPU 120 after Fast Fourier Transform (FFT) for joint signal post-processing.

The DSPs 111 are further configured to receive pre-compensated transmit samples $x_k$ from the VPU 120 for further transmission, and to receive post-compensated receive samples $y'_k$ from the VPU 120 for further detection. Alternatively, the DSPs 111 may receive correction samples to add to the initial frequency samples before further transmission or detection.

The VPU 120 is configured to mitigate the FEXT induced over the subscriber lines. The VPU 120 comprises a linear precoder configured to multiply a vector $u_k$ of transmit frequency samples with a precoding matrix $P_k$ in order to pre-compensate an estimate of the expected FEXT, and a linear postcoder configured to multiply a vector of receive frequency samples $y_k$ with a postcoding matrix $Q_k$ so as to post-compensate an estimate of the incurred FEXT.

In the matrix $P_k$ or $Q_k$, a row i is associated with a particular victim line $L_i$, while a column j is associated with a particular disturber line $L_j$.

The VCU 130 is basically for controlling the operation of the VPU 120, and more specifically for estimating the crosstalk coefficients between the vectored lines, and for initializing and updating the coefficients of the precoding matrix $P_k$ and of the postcoding $Q_k$ from the crosstalk estimates.

The various channel couplings are estimated based on pilot signals (a.k.a crosstalk probing signals) transmitted over the vectored lines. The pilot signals are typically transmitted during dedicated time periods and/or over dedicated tones.

For instance, in G.993.5 ITU recommendation (vectored VDSL2), the transceiver units send pilot signals on the so-called SYNC symbols. The SYNC symbols occur periodically after every super frame, and are transmitted synchronously over all the vectored lines (super frame alignment). A similar technique has been adopted in G.fast.

On a given disturber line, a subset of the tones of a SYNC symbol (a.k.a. probe tones) are all 4-QAM modulated by the same pilot digit from a given pilot sequence, and transmit one of two complex constellation points, either '1+j' corresponding to '+1' or '−1−j' corresponding to '−1' (vectored VDSL2); or transmit one of three complex constellation points, either '1+j' corresponding to '+1' or '−1−j' corresponding to '−1' or '0+0j' corresponding to '0' (G.fast).

On a given victim line, both the real and imaginary parts of the received DFT sample before equalization (G.fast), or of the normalized slicer error, which is the difference vector between the received and properly equalized DFT sample and the constellation point onto which this DFT sample is demapped (vectored VDSL2 and G.fast), are measured and reported to the VCU 130 for estimation of the various channel couplings.

The successive error samples gathered over a given victim line are next correlated with the pilot sequence used over a given disturber line in order to obtain an estimate of the channel coupling from the given disturber line into the given victim line. To reject the crosstalk contributions from the other disturber lines, the pilot sequences used over the respective disturber lines are mutually orthogonal (e.g., Walsh-Hadamard sequences).

Presently, the VCU 130 starts first by configuring the transceivers 110 and 210 with the respective pilot sequences to use for modulation of the probe tones of the SYNC symbols. The pilot sequences comprises T pilot digits using $\{+1, -1\}$ or $\{+1, 0, -1\}$ as alphabet. The pilot digit that modulates a given tone k during SYNC symbol position t over line $L_j$ is denoted as $w_{j,k}^t$.

The VCU 130 next gathers measurement samples as measured by the transceivers 110 and 210 while SYNC symbols are being transmitted. The measurement sample as measured by the transceiver 110$i$ or 210$i$ over a victim line $L_i$ at tone k during SYNC symbol position t is denoted as $e_{j,k}^t$.

The VCU 130 correlates T measurement samples $\{e_{j,k}^t\}_{t=t_0 \ldots t_0+T-1}$ as measured over a given victim line $L_i$ during a complete acquisition cycle with the T pilot digits $\{w_{j,k}^t\}_{t=t_0 \ldots t_0+T-1}$ of the pilot sequence used over a given disturber line $L_j$ so as to obtain an estimate of the channel coupling $H_{ij,k}$ from the disturber line $L_j$ into the victim line $L_i$ at frequency index k. As the pilot sequences are mutually orthogonal, the contributions from the other disturber lines reduce to zero after this correlation step.

The VCU 130 determines estimates of the channel matrix or of the normalized channel matrix at respective tones k based on these correlation results. The nominal channel matrix is derived from a measure of the raw receive signals before equalization, whereas the normalized channel matrix—normalization is with respect to the direct channel gains—is derived from a measure of the slicer errors after channel equalization. If the SYNC symbols are passed through the precoder or postcoder, then it is the matrix representing the concatenation of the channel matrix with the preceding or postcoding matrix, meaning the residual crosstalk channel matrix, that is measured and estimated.

The channel estimates are eventually used for initializing or updating the coefficients of the precoding matrix $P_k$ or of the postcoding matrix $Q_k$. The VCU 130 writes the so-determined vectoring coefficients into the internal memory of the VPU 120 for easy and fast retrieval.

Figure 3:
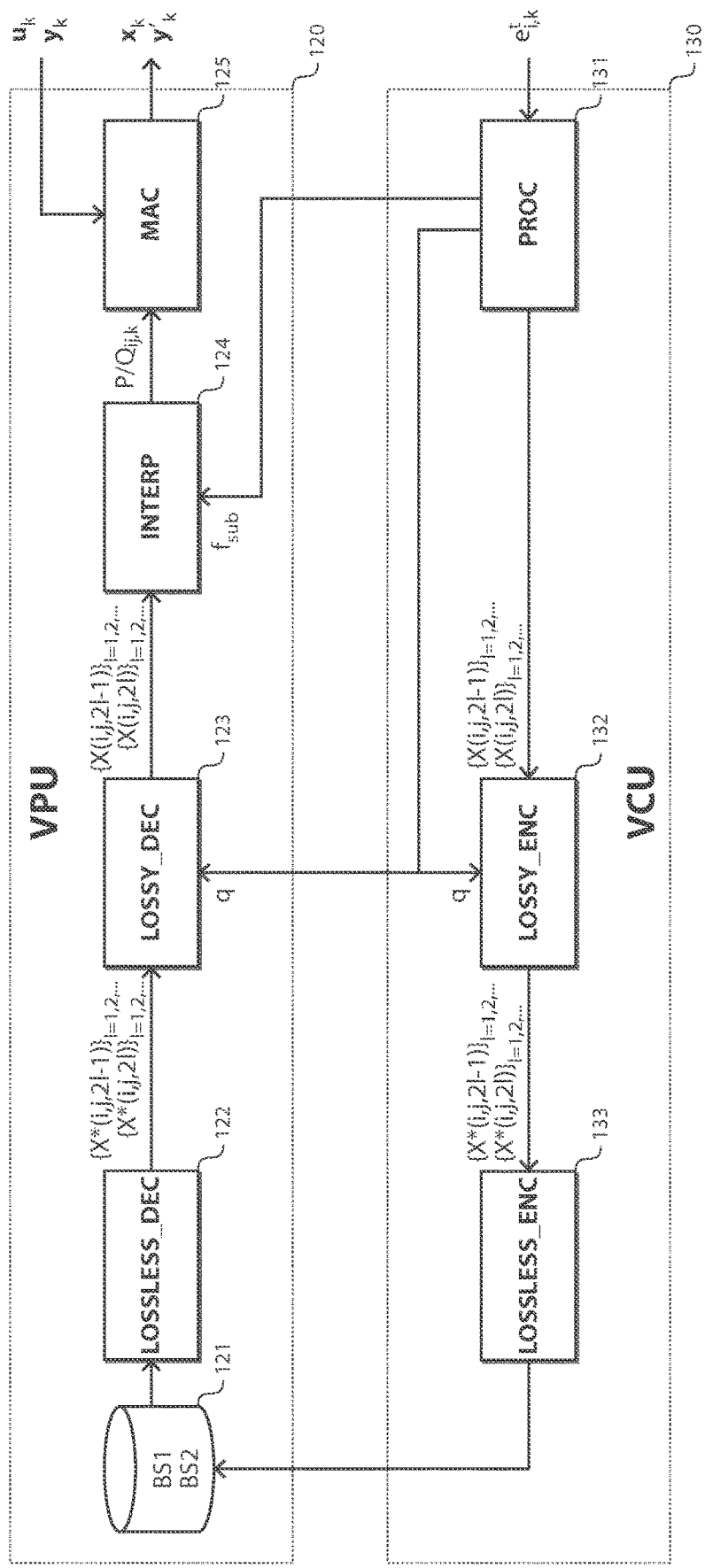
FIG. 3 represents further details about a vectoring controller and processor.

There is seen in FIG. 3 further details about the VPU 120 and the VCU 130.

The VCU 130 is shown as comprising:
a processing unit 131 (or PROC);
a lossy encoder 132 (or LOSSY_ENC); and
a lossless encoder 133 (or LOSSLESS_ENC).

The VPU 120 is shown as comprising:
on-chip fast-access memory 121 (or MEM);
a lossless decoder 122 (or LOSSLESS_DEC);
a lossy decoder 123 (or LOSSY_DEC);
an interpolator 124 (or INTERP); and
a Multiply & Accumulate (MAC) unit 125.

An output of the processing unit 131 is coupled to an input of the lossy encoder 132. An output of the lossy encoder 132 is coupled to an input of the lossless encoder 133. An output of the lossless encoder 133 is coupled to an input of the VPU's internal memory 121. An input of the lossless decoder 122 is coupled to an output of the memory 121, and an output of the lossless decoder 122 is coupled to an input of the lossy decoder 123. An output of the lossy decoder 123 is coupled to an input of the interpolator 124. And an output of the interpolator 124 is coupled to an input of the MAC unit 125.

A control output of the processing unit 131 is coupled to a control input of the interpolator 124. A further control output of the processing unit 131 is coupled to control inputs of the lossy encoder 132 and lossy decoder 123.

An input of the processing unit 131 is coupled to outputs of the transceivers 110, through which error samples $e_{j,k}^t$ from the transceivers 110 (upstream) and 210 (downstream) are received. A further input of the MAC unit 125 is coupled to outputs of the transceivers 110, through which uncompensated transmit samples $u_k$ (downstream) and uncompensated receive samples $y_k$ (upstream) are received from the transceivers 110. And an output of the MAC unit 125 is coupled to further inputs of the transceivers 110, through which pre-compensated transmit samples $x_k$ (downstream) and post-compensated receive samples y'k (upstream) are sent to the transceivers 110.

The processing unit 131 organizes the whole set of downstream or upstream tones into sub-bands. For each sub-band and victim line, the processing unit 131 selects a particular sub-sampling (or decimation) factor $f_{sub}$ for the compression algorithm. The selected sub-sampling factor $f_{sub}$ determines the position of the so-called reference tones in that sub-band, and the reference tones in turn delineate the sub-band into groups of tones. The vectoring coefficient values at the reference tones are explicitly stored into the VPU's memory, while the vectoring coefficient values at the remaining tones need to be inferred from the stored values at one or more reference tones The selected sub-sampling factor $f_{sub}$ is chosen in order to optimize tradeoffs between coefficient accuracy and compressed data size. The selected sub-sampling factor $f_{sub}$ is written by the processing unit 131 into some register memory of the VPU 120 for further reading by the interpolator 124.

Let $k_l$ denote the $l^{th}$ reference tone in a sub-band with $l=1, 2 \ldots$: $k_l=k_{min}+(l-1)f_{sub}$, wherein $k_{min}$ denotes the lowest tone index of the considered sub-band. Let $G_l$ denotes the group of tones spanning from one reference tone $k_l$ up to the next (not included): $G_l=\{k_l; k_l+1; \ldots; k_{l+1}-1\}=\{k_{min}+(l-1)f_{sub}; k_{min}+(l-1)f_{sub}+1; \ldots; k_{min}+lf_{sub}-1\}$. Thus each tone group starts with one reference tone Followed by $f_{sub}1$ non-reference tones. The reference tones can be at a different position in the tone groups, for instance at last or middle position.

The processing unit 131 receives the error samples $e_{j,k}^t$ from the respective transceivers 110 and 210, and determines vectoring coefficient values at the reference tones $k_l$ from the error samples as aforementioned. The sub-sampling factor $f_{sub}$ used for data compression does not necessarily match the sub-sampling factor that is used by the transceivers 110 and 210 for error measurement and reporting in the corresponding sub-band. For instance, there might be twice or three times as many measured tones as reference tones, in which case the vectoring coefficient value at a reference tone can be derived from a weighted average of multiple vectoring coefficient values at multiple tones (not necessarily belonging to the same tone group).

The real and imaginary parts of the vectoring coefficients are encoded as two signed integer values in fixed point representation using typically 8; 12 or 16 bits. These integer values represent the quantization intervals wherein the real or imaginary parts of the vectoring coefficients are enclosed. They should be multiplied by an implicit scaling factor to recover the actual coefficient values.

The processing unit 131 supplies the lossy encoder 132 with sequences $\{x(i,j,n)\}n=1, 2, \ldots$ of signed integer values indicative of the vectoring coefficient values. Each sequence $\{x(i,j,n)\}n=1, 2, \ldots$ corresponds to a particular disturber line $L_j$—victim line $L_i$ combination, and to a particular sub-band. Within each sequence, the elements are organized by pairs: the two consecutive elements $\{x(i,j,2l-1); x(i,j,2l)\}$ represent the real and imaginary parts respectively of the precoding coefficient $Pij,k_l$ or postcoding coefficient $Qij,k_l$ as estimated by the processing unit 131 at the reference tone $k_l$ of the respective tone group Gl, namely $x(i,j,2l-1)=real(P/Qij, k_l)$ and $x(i,j,2l)=imag(P/Qij,k_l)$.

Alternatively, the supplied integer values can be indicative of difference values between the vectoring coefficient values $Pij,k_l$ or $Qij,k_l$ at the reference tones kl and the vectoring coefficient values $Pij,k_{l\pm1}$ or $Qij,k_{l\pm1}$ at the neighboring reference tones $k_{l\pm1}$.

For each sub-band and victim line $L_i$, the processing unit 131 further selects a quantization level q, which is defined as the number of least significant bits from the vectoring coefficients that can be skipped. The quantization level q is typically chosen according to the expected path loss and expected crosstalk level for that particular sub-band and victim line in order to achieve a given crosstalk cancellation depth, and assuming a given cap on the bit loading.

The chosen quantization parameter q is passed to the lossy encoder 132, and is further written by the processing unit 131 into some register memory of the VPU 120 for further reading by the lossy decoder 123.

The lossy encoder 132 shifts the original signed binary words $X(i,j,n)$ by q bits rightwards, or alternatively divides them by 29. The lossy encoder 132 supplies the so-truncated sequences of signed integer values $\{X^*(i,j,n)\}n=1, 2, \ldots$ to the lossless encoder 133. Let S1 denote the nominal number of bits used for encoding the respective integer values $X^*(i,j,n)$ at the output of the lossy encoder 132, typically 8, 12 or 16 bits minus the quantization parameter q.

The lossless encoder 133 should transform the sequence of integer values $\{x^*(i,j,l)\}n=1, 2, \ldots$ into a stream of bits in such a way that the length of the stream of bits is typically small, and that the bits can be transformed back to the original sequence of integers with low complexity hardware. Each sequence of integer values $\{X^*(i,j,n)\}n=1, 2, \ldots$ is encoded separately.

The signed integers $X^*(i,j,n)$ are first converted to unsigned integers $U(i,j,n)$ as:

$$U(i,j,n)=2X^*(i,j, n) \text{ if } X^*(i,j,n) \geq 0$$

$$U(i,j,n)=-2X^*(i,j,n)-1 \text{ if } X^*(i,j,n)<0 \qquad (2),$$

meaning that 0, 1, −1, 2, −2, . . . are respectively encoded as 0, 2, 1, 4, 3, . . . .

The lossless encoder 133 encodes the first pair of unsigned integers $\{U(i,j,1); U(i,j,2)\}$ (representing the real and imaginary part of the first vectoring coefficient) in normal binary notation using the nominal number of bits $S(i,j,1)=S1$.

The lossless encoder 133 determines minimum required numbers of bits $S(i,j,2), S(i,j,3), \ldots$ for respectively encoding the second and subsequent pairs of unsigned integers $\{U(i,j,3); U(i,j,4)\}, \{U(i,j,5); U(i,j,6)\}, \ldots$ (representing the real and imaginary parts of the second and subsequent vectoring coefficients) as: $S(i,j,l)=\max[\text{Ceil}(\text{Log } 2(U(i,j,2l-1)+1)); \text{Ceil}(\text{Log } 2(U(i,j,2l)+1))]$ for $l=2, 3, \ldots$ (3).

The lossless encoder 133 adjusts the sequence of encoding sizes $\{S(i,j,l)\}l=1, 2, \ldots$ to yield a new sequence of constrained encoding sizes $\{S^*(i,j,l)\}l=1, 2, \ldots$ that fulfills the Following conditions:

$S^*(i,j,l)=S(i,j,l)=S1$ (4), meaning that the first encoding size is kept unchanged;

$S^*(i,j,l) \leq S(i,j,l)$ for $l=2, 3, \ldots$ (5), meaning that the second and subsequent encoding sizes are kept unchanged, or are incremented by one unit or more; and $|S^*(i,j,l)-S^*(i,j,l-1)| \circ T$ for $l=2, 3, \ldots$ (6), meaning that any two successive elements of the adjusted sequence do not differ from each other by more than a given threshold T.

For instance, if T=1, then any selected value in the adjusted sequence $\{S^*(i,j,l)\}l=1, 2 \ldots$ cannot differ from the previous value by more than 1 unit, or equivalently $S^*(i,j,l)=S^*(i,j,l-1)$ or $S^*(i,j,l)=S^*(i,j,l-1)+1$ or $S^*(i,j,l)=S^*(i,j,l-1)-1$.

The adjustment is done in such a way that the incremented sizes $S^*(i,j,2), S^*(i,j,3), \ldots$ are as close as possible to the respective minimum required sizes $S(i,j,2), S(i,j,3), \ldots$ while fulfilling condition (6). This is easily achieved by a simple algorithm with a single forward and backward pass.

The adjustment may also involve decrementing the nominal encoding sizes $S(i,j,1)$ so as to lessen the amount of increments for the second and subsequent elements $S(i,j,2), S(i,j,3), \ldots$, in which case condition (4) is replaced by:

$$\max[\text{Ceil}(\text{Log } 2(U(i,j,1)+1)); \text{Ceil}(\text{Log } 2(U(i,j,2)+1))] \circ S^*(i,j,1) \circ S(i,j,1)=S1 \qquad (7).$$

The lossless encoder 133 derives a sequence of differences values $\{D(i,j,l)\}l=1, 2, \ldots$ from the sequence of constrained encoding sizes $\{S^*(i,j,l)\}l=1, 2 \ldots$ as:

$$D(i,j,l)=S^*(i,j,l+1)-S^*(i,j,l) \qquad (8),$$

and writes the so-derived sequence of differences values $\{D(i,j,l)\}l=1, 2, \ldots$ into the VPU's on-chip memory 121 as a first serial bit stream BS1.

The sequence of differences values $\{D(i,j,l)\}l=1, 2, \ldots$ comprises signed integer values whose absolute value is not greater than T. Each element of the sequence $\{D(i,j,l)\}l=1, 2 . . . is encoded in two's complement binary notation using S2=Ceil(Log 2(2T+1)) bits. For instance, if T=1, then each difference value is encoded as a 2-bit value: '0' is encoded as '00', '+1' as '01', and '−1' as '11'.

Alternatively, the lossless encoder 133 may use a variable-length code to encode the difference values D(i,j,l). For instance, and still assuming T=1, '0' is encoded as the single-digit value '0', '+1' is encoded as the double-digit value '10', and '−1' as '11'. The first bit value determines whether the difference value D(i,j,l) is encoded as a single-digit or double-digit word. This embodiment is particularly advantageous as the encoding sizes are likely to be identical across neighboring tones, and then the occurrence of the difference value '0' is likely to be considerably higher than the occurrence of the difference values '−1' and '−1'.

Any other decodable assignment with 2T+1 codewords could be used as well.

If the first encoding size S*(i,j,1) is a variable size (i.e., not always made equal to S1), then the lossless encoder 133 prepends the value S*(i,j,1) to the serial bit stream BS1. The value S*(i,j,1) is encoded using a fixed number of bits S3 in normal binary notation (for instance 5 bits for encoding any integer size between 0 and 31).

The lossless encoder 133 next encodes the pairs of unsigned integer values {U(i,j,2l−1); U(i,j,2l)}l=1, 2, . . . using the respective constrained numbers of bits {S*(i,j,l)}l=1, 2, . . . in normal binary notation, and writes the so-encoded unsigned integer values into the VPU's on-chip memory 121 as a second serial bit stream BS2.

As an illustrative example, the table below gives the minimum required numbers of bits and corresponding codewords when encoding the unsigned integer values U(i,j,l) .

| Original Integer Value | Unsigned Codeword | Minimum Number of Bits |
|---|---|---|
| −4 | 111 | 3 |
| −3 | 101 | 3 |
| −2 | 11 | 2 |
| −1 | 1 | 1 |
| 0 |  | 0 |
| 1 | 10 | 2 |
| 2 | 100 | 3 |
| 3 | 110 | 3 |
| 4 | 1000 | 4 |

If a higher number of bits than the minimum required number of bits is used, then an appropriate number of '0' digits need to be prepended to the original codeword. For instance, '−4' would be encoded as '0111' if 4 bits were actually used (instead of 3).

As one can notice, one does not need any payload to encode the null integer value '0' ('0' as encoding size is implicitly meant to be '0' as encoded value too). Alternatively, the null integer value could be encoded as the single-digit value '0', in which case equation (3) for the minimum required numbers of bits is to be slightly modified.

The lossless decoder 122 reads the bit streams BS1 and BS2 from the on-chip memory 121, and performs the inverse decoding steps.

The lossless decoder 122 first picks-up twice S1=S*(i,j,1) bits from the second bit stream BS2, S1 value being preliminarily known, and decodes the first pair of unsigned integer values {U(i,j,1); U(i,j,2)}.

Next, the lossless decoder 122 picks-up the first S2 bits from the first bit stream BS1, S2 being also preliminarily known, and decodes them in two-complement notation to determine the first difference value D(i,j,1), yielding S*(i,j,2)=S1+D(i,j,1) as encoding size for the second pair of integer coefficients (i.e, by adding the first difference value D(i,j,1) to the nominal number of bits S1). The lossless decoder 122 picks-up twice S*(i,j,2) bits from the second bit stream BS2, and decodes the second pair of unsigned integer values {U(i,j,3); U(i,j,4)}. The lossless decoder 122 prepends S1−S*(i,j,2) most significant bits set to '0' to the decoded binary words so as their length conform to the nominal number of bits S1.

The lossless decoder 122 picks-up the next S2 bits from the first bit stream BS1, and decodes them in two-complement notation to determine the second difference value D(i,j,2), yielding S*(i,j,3)=S*(i,j,2)+D(i,j,2) as encoding size for the third pair of integer coefficients (i.e., by adding the second difference value D(i,j,2) to the previously determined encoding size S*(i,j,2)). The lossless decoder 122 picks-up twice S*(i,j,3) bits from the second bit stream BS2, and decodes the third pair of unsigned integer values {U(i,j,5); U(i,j,6)}. The lossless decoder 122 prepends S1−S*(i,j,3) most significant bits set to '0' to the decoded binary words so as their length conform to the nominal number of bits S1.

And so forth with the remaining difference values and with the remaining pairs of unsigned integer coefficients, yielding a complete sequence of recovered pairs of unsigned integer coefficients {U(i,j,n)}n=1, 2, . . . , each element of the sequence being encoded using the nominal number of bits S1.

The unsigned integer coefficient U(i,j,n) are converted into respective signed integer coefficients X*(i,j,n) in two's complement binary notation by reverting the previous assignment (2), whereby even integer values correspond to positive or null integers and odd integer values correspond to negative integers.

The sequence of signed integers {X*(i,j,n)}n=1, 2, . . . is fed to the lossy decoder 123. The lossy decoder 123 appends q least significant bits preferably set to '0' to the signed integers to recover the default word size that is used in the MAC unit 125. The sequence of the so-stuffed bi nary words {X(i,j,n)}n=1, 2, . . . i s supplied to the interpolator 124.

The interpolator 124 first assigns the odd-indexed coefficient values X(i,j,2l−1) as the real parts of the vectoring coefficients at the respective reference tones $k_l$, namely real(P/Qij,$k_l$)=X(i,j,2l−1), and the even-indexed coefficient values X(i,j,2l) as the imaginary parts of the vectoring coefficients at the respective reference tones $k_l$, namely imag(P/Qij,$k_l$)=X(i,j,2l). The interpolator 124 derives the position of the reference tones in that particular sub-band from the sub-sampling factor $f_{sub}$ read from the register memory The interpolator 124 passes the complex vectoring coefficients P/Qij,$k_l$ at the reference tones $k_l$ to the MAC unit 125.

Next, the interpolator 124 determines the vectoring coefficient values at the intermediary tones k with $k_l$<k<$k_{l+1}$ by constant (a.k.a. zero-hold), linear or polynomial interpolation from the vectoring coefficient values at one or more reference tones. The interpolated complex vectoring coefficients P/Qij,k at the intermediary tones k are passed to the MAC unit 125.

If the vectoring coefficients are encoded and stored as difference values, then the interpolator 124 needs first to derive the correct vectoring coefficient values from the decoded difference values and the previously-determined coefficient values before proceeding further with coefficient interpolation.

The MAC unit 125 is configured to multiply, for each victim line $L_i$, a vectored of user downstream data samples $u_k$ with the preceding matrix row $P_{i\bullet,k}$ for generating a pre-compensated transmit sample $x_k$. The pre-compensated transmit sample $x_{i,k}$ is returned to the transceiver 110$i$ for further transmission over line $L_i$.

Similarly, the MAC unit 125 is configured to multiply, for each victim line $L_i$, a vectored of received upstream data samples $y_k$ with the postcoding matrix row $Qi\bullet,k$ for generating a post-compensated receive sample y'i,k. The post-compensated receive sample y'i,k is returned to the transceiver 110$i$ for further detection.

In an alternative embodiment, the real and imaginary parts of the vectoring coefficients are split into two distinct sequences to be encoded separately by the lossless encoder 133 using respective (and possibly different) encoding sizes. This could be the case for instance if the real and imaginary parts of the vectoring coefficients exhibit low-correlation between each other.

In still an alternative embodiment, the sequence of signed integers $\{X^*(i,j,n)\}n=1,2,\ldots$ are directly encoded in two-complement notation.

The minimum required numbers of bits are determined as:

$$S(i,j,l)=\max[f(X^*(i,j,2l-1));\ f(X^*(i,j,2l))] \quad (9),$$

wherein the function f is defined as:

$$f(x) = \begin{cases} \text{Ceil}(\log_2(-x)) + 1 & if\ x < 0 \\ 0 & if\ x = 0 \\ \text{Ceil}(\log_2(x+1)) + 1 & if\ x \geq 0 \end{cases} \quad (10)$$

The sequence $\{S(i,j,l)\}l=1, 2, \ldots$ is then adjusted as per equations (4), (5) and (6), or as per equations (7), (5) and (6), to yield a new sequence of constrained encoding sizes $\{S^*(i,j,l)\}l=1, 2, \ldots$.

As an illustrative example, the table below gives the minimum required numbers of bits and corresponding codewords when directly encoding the signed integer values x*(i,j,l).

| Original Integer Value | Signed Codeword | Minimum Number of Bits |
| --- | --- | --- |
| −4 | 100 | 3 |
| −3 | 101 | 3 |
| −2 | 10 | 2 |
| −1 | 1 | 1 |
| 0 | | 0 |
| 1 | 01 | 2 |
| 2 | 010 | 3 |
| 3 | 011 | 3 |
| 4 | 0100 | 4 |

If a higher number of bits than the minimum required number of bits is used, then an appropriate number of '0' or '1' digits need to be prepended to the original codeword depending on the integer's sign. For instance, '−4' would be encoded as '1100' if 4 bits were actually used (instead of 3), and '+4' would be encoded as '00100' if 5 bits were actually used (instead of 4).

Similarly, the lossless decoder 122 prepends S1−S*(i,j,l) most significant bits set to '0' to the decoded binary words if their most significant bit is equal to '0' (positive integer values), or prepends S1−S*(i,j,l) most significant bits set to '1' to the decoded binary words if their most significant bit is equal to '1' (negative integer values) The signed integer values are then stuffed with q least significant bits preferably set to '0'.

In still an alternative embodiment, the lossless decoder 133 determines the sequence of constrained sizes $\{S^*(i,j,l)\}l=1, 2, \ldots$ by first initializing its elements to the nominal value S1, and then by decrementing its second and subsequent elements as much as possible while Fulfilling both conditions (5) and (6).

In still an alternative embodiment, the coefficient integer values are represented in floating point representation. Typically, the exponent value is encoded as a single integer value valid for both the real and imaginary parts of the vectoring coefficients, and possibly as a single integer value further valid for all the tones of a tone group. The sequences of real and imaginary mantissa values for each and every disturber line—victim line combination and for each and every sub-band are then differentially encoded as per the present invention.

Another numeral system other than the binary system could be used as well, in which case the base-2 logarithm in the above formulas is to be replaced by the base-M logarithm, M denoting the radix (or base) of the considered numeral system.

Last, the proposed compression and decompression schemes could also be used for storing and retrieving the coefficient values of the channel matrix or normalized channel matrix at the reference tones, or for storing the coefficient values of a matrix decomposition of the channel matrix or normalized channel matrix at the reference tones, such as LU matrix decomposition, QR matrix decomposition or singular value matrix decomposition.

It is to be noticed that the term 'comprising' should not be interpreted as being restricted to the means listed thereafter. Thus, the scope of the expression 'a device comprising means A and B' should not be limited to devices consisting only of components A and B. It means that with respect to the present invention, the relevant components of the device are A and B.

It is to be further noticed that the term 'coupled' should not be interpreted as being restricted to direct connections only. Thus, the scope of the expression 'a device A coupled to a device B' should not be limited to devices or systems wherein an output of device A is directly connected to an input of device B, and/or vice-versa. It means that there exists a path between an output of A and an input of B, and/or vice-versa, which may be a path including other devices or means.

The description and drawings merely illustrate the principles of the invention. It will thus be appreciated that those skilled in the art will be able to devise various arrangements that, although not explicitly described or shown herein, embody the principles of the invention. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures may be provided through the use of dedicated hardware as well as hardware capable of executing software in association with appropriate software. when provided by a processor, the functions may be provided by a single dedicated processor, by a single shared processor, or by a plurality of individual processors, some of which may be shared. Moreover, a processor should not be construed to refer exclusively to hardware capable of executing software, and may implicitly include, without limitation, Digital Signal Processor (DSP) hardware, network processor, Application Specific Integrated Circuit (ASIC), Field Programmable Gate Array (FPGA), etc. other hardware, conventional and/or custom, such as Read Only Memory (ROM), Random Access Memory (RAM), and non volatile storage, may also be included.

The invention claimed is:

1. A method for encoding a first sequence of integer coefficient values indicative of coupling coefficient values, wherein the method comprises:
    determining a second sequence of numbers of digits for encoding the respective integer coefficient values of the first sequence, the second sequence comprising, as first element, a first number of digits for encoding the first integer coefficient value of the first sequence, and as second and subsequent elements, constrained numbers of digits that are greater than or equal to respective minimum required numbers of digits for encoding the second and subsequent integer coefficient values of the first sequence, the constrained numbers of digits being such that any two successive elements of the second sequence do not differ from each other by more than a given threshold value;
    encoding difference values between the successive elements of the second sequence; and
    encoding the integer coefficient values of the first sequence using the respective numbers of digits of the second sequence.

2. A method according to claim 1, wherein the method further comprises encoding a further first sequence of integer coefficient values using the respective numbers of digits of the second sequence,
    and wherein the constrained numbers of digits are greater than or equal to respective further minimum required numbers of digits for encoding the second and subsequent integer coefficient values of the further first sequence.

3. A method according to claim 1, wherein the first number of digits is a nominal number of digits preliminarily known.

4. A method according to claim 1, wherein the method further comprises:
    adjusting the first number of digits of the second sequence; and
    encoding the so-adjusted first number of digits of the second sequence.

5. A method according to claim 1, wherein the method further comprises:
    initializing the second and subsequent numbers of digits of the second sequence as being equal to the respective minimum required numbers of digits; and
    incrementing at least one of the second and subsequent numbers of digits of the second sequence till the successive elements of the second sequence do not differ from each other by more than the given threshold value.

6. A method according to claim 1, wherein the coupling coefficient values are vectoring coefficient values for use in a vectoring processor, the encoding is for the storage of the integer coefficient values in a memory area of the vectoring processor, and the first sequence corresponds to a particular disturber-victim combination.

7. A method according to claim 1, wherein the integer coefficient values are indicative of respective quantization intervals wherein the respective coupling coefficient values are enclosed.

8. A method according to claim 1, wherein the difference values are each encoded using Ceil(LogM(2T+1)) digits, M denoting a radix of the numeral system that is used for representing integer values, T denoting the given threshold value, and Ceil(x) denoting the lowest integer value that is greater than or equal to x.

9. A method according to claim 1, wherein the difference values are encoded using a variable-length code.

10. An encoder encoding a first sequence of integer coefficient indicative of coupling coefficient values,
    wherein the encoder is configured:
        to determine a second sequence of constrained numbers of digits for encoding the respective integer coefficient values of the first sequence, the second sequence comprising, as first element, a first number of digits for encoding the first integer coefficient value of the first sequence, and as second and subsequent elements, constrained numbers of digits that are greater than or equal to respective minimum required numbers of digits for encoding the second and subsequent integer coefficient values of the first sequence, the constrained numbers of digits being such that any two successive elements of the second sequence do not differ from each other by more than a given threshold value;
        to encode difference values between the successive elements of the second sequence; and
        to encode the integer coefficient values of the first sequence using the respective numbers of digits of the second sequence.

11. A vectoring controller comprising an encoder according to claim 10.

12. A method for decoding a first sequence of encoded integer coefficient values indicative of coupling coefficient values,
    wherein the method comprises:
        decoding a first integer coefficient value of the first sequence using a first number of digits;
        decoding difference values between successive elements of a second sequence of numbers of digits, the second sequence having the first number of digits as first element;
        determining second and subsequent numbers of digits of the second sequence from the difference values; and
        decoding second and subsequent integer coefficient values of the first sequence using the respective so-determined second and subsequent numbers of digits of the second sequence.

13. A method according to claim 12, wherein the first number of digits is a nominal number of digits preliminarily known.

14. A method according to claim 12, wherein the method initially comprises decoding the first number of digits.

15. A method according to claim 12, wherein the coupling coefficient values are vectoring coefficient values for use in a vectoring processor, the decoding is for the reading of the encoded integer coefficient values from a memory area the vectoring processor, and the first sequence corresponds to a particular disturber-victim combination.

16. A decoder for decoding a first sequence of encoded integer coefficient values indicative of coupling coefficient values, wherein the decoder is configured:
to decode a first integer coefficient value of the first sequence using a first number of digits;
to decode difference values between successive elements of a second sequence of numbers of digits, the second sequence having the first number of digits as first element;
to determine second and subsequent numbers of digits of the second sequence from the difference values; and
to decode second and subsequent integer coefficient values of the first sequence using the respective so-determined second and subsequent numbers of digits of the second sequence.

17. A vectoring processor comprising a decoder according to claim 16.

* * * * *